United States Patent [19]
Hoshinoughi et al.

[11] Patent Number: 5,147,760
[45] Date of Patent: Sep. 15, 1992

[54] METHOD OF EXPOSING PRINTED WIRING BOARDS HAVING THROUGH HOLES

[75] Inventors: Susumu Hoshinoughi; Akio Yoshida; Akinobu Kawazu, all of Amagasaki, Japan

[73] Assignee: Mitsubishi Denki Kabushiki Kaisha, Tokyo, Japan

[21] Appl. No.: 544,646

[22] Filed: Jun. 27, 1990

[30] Foreign Application Priority Data

Jul. 21, 1989 [JP] Japan .................................. 1-189769
Jul. 21, 1989 [JP] Japan .................................. 1-189770

[51] Int. Cl.$^5$ .............................................. G03F 7/20
[52] U.S. Cl. ..................... 430/296; 430/311; 430/395; 430/942; 430/945
[58] Field of Search .................. 430/30, 270, 290, 296, 430/311, 312, 318, 319, 320, 394, 395, 942, 945

[56] References Cited

U.S. PATENT DOCUMENTS 4,612,275  9/1986  Gregor .............................. 430/942
4,883,571  11/1989  Kondo et al. ...................... 430/318

OTHER PUBLICATIONS

Kawazu et al., "Electron Beam Direct Writing Technology For Printed Wiring Board", IEEE/CHMT '89 IEMT Symposium, 1989, pp. 246-250.

Technical Report of Mitsubishi Electric Corporation, vol. 63, Nov. 2, 1989, pp. 75-78, by Hoshino et al.

Primary Examiner—Marion E. McCamish
Assistant Examiner—Kathleen Duda
Attorney, Agent, or Firm—Leydig, Voit & Mayer

[57] ABSTRACT

A method of exposing the resist on a printed wiring board having through holes for connecting planar circuit patterns on the plane surfaces of the substrate is disclosed, wherein an electron beam direct writing system is utilized for scanning a converging electron beam as the exposure energy. The electron beam produced by the system enters the opening of the through hole, forming an inclination angle different from 0 degrees and up to 7 degrees with respect to the normal to the opening area of the through hole, such that the resist on the wall surface of the through hole is exposed simultaneously both by the direct and the reflected electron beam. The amount of exposure per unit area of the opening of the through hole may be controlled to 2h/r times the amount of exposure per unit area over the planar surface of the substrate, wherein h and r are the depth and the radius of the through holes, respectively. A reflector plate may be disposed at the bottom opening of the through holes to further enhance the utilization efficiency of the electron beam during through-hole wall surface exposure.

3 Claims, 6 Drawing Sheets

METHOD OF EXPOSING PRINTED WIRING BOARDS HAVING THROUGH HOLES

BACKGROUND OF THE INVENTION

This invention relates to a method of exposing printed wiring boards, such as multilayer printed wiring boards, which comprise, in addition to circuit patterns formed on plane surfaces, circuit patterns extending through through-holes so as to connect the planar circuit patterns with each other.

In the case of mulitlayer printed circuit or wiring boards, the circuit patterns formed on planar surfaces of the boards are connected via circuit patterns extending through through-holes formed in the boards. Such circuit patterns, which include patterns extending through through-holes as well as patterns formed on planar surfaces of the boards, may be formed by means of the photolithography method utilizing masks.

FIG. 1 shows a vertical section of a device for exposing printed wiring boards having through-holes, which device is disclosed in a recent article by A. Hoshino et al.: Mitsubishi Denki Giho [Technical Reports of Mitsubishi Electric Corporation], vol. 63. No. 2, 1989, pp. 75 through 78. In the figure, substrate 1 of a printed wiring board having a plurality of through holes 2 is covered by a negative type photoresist 3 formed on the substrate 1 by the electro-deposition method. It is noted that the resist 3 covers the wall surfaces of the through holes 2 as well as the plane surfaces of the substrate 1. Mask films 4, having patterns corresponding to the circuit patterns, are disposed on both main planar surfaces of the substrate 1. Each one of the two units of the exposing device, disposed above and below the substrate 1, comprises a lamp 5 for exposure, a reflector mirror 6, and a slit 7, and emits ultraviolet light 8 diverging by an angle $\theta$ with respect to the central optical axis of the lamp 5 normal to the main plane surfaces of the substrate 1. The exposing device, or the substrate 1, is translated in the direction A during the exposure.

The resist pattern corresponding to the desired circuit pattern is formed on the substrate 1 as follows. First, all the surfaces of the substrate 1 having through holes 2 are covered by resist 3 by means, for example, of the electrodeposition method. Then, the mask films 4 are disposed on the plane surfaces of the substrate 1, so that the resist 3 is exposed to the ultraviolet light 8 which is selectively transmitted through the mask films 4. Thereafter, the substrate 1 is exposed by means of the exposing device as shown in FIG. 1, wherein the exposing device or the substrate 1 is translated in the direction A, while the divergence angle $\theta$ of the ultraviolet light 8 is defined by the slit 7. Thus, the portions of the resist 3 on the plane surfaces of the substrate 1 corresponding to the circuit patterns that are to be formed thereon are selectively exposed; in addition, the whole wall surface areas of the resist 3 within the through holes 2 of the substrate 1 are exposed. After the above sequence of operations, the resist 3 on the substrate 1 is developed; thus, the portions of the negative type resist 3 which have become insoluble as a result of the exposure to the ultraviolet light are retained and a resist pattern corresponding to the circuit pattern that is to formed on the printed wiring board is formed on the substrate 1.

However, the above method of exposing printed wiring boards having through holes has a disadvantage. Namely, the amount of exposure of the wall surface of the through holes 2 is small compared with the amount of exposure of the planar surfaces of the substrate 1. When the thickness of the substrate 1 is 1.6 mm and the diameter of the through holes 2 is 0.4 mm, the ratio, Wt/Ws, of the exposure, Wt, of the wall surfaces of the through holes 2, to the exposure, Ws, of the plane surfaces of the substrate 1, varies as shown in FIG. 2 as a function of the divergence angle $\theta$ of the ultraviolet light 8. In FIG. 2, the exposure ratio Wt/Ws is plotted in percent (%) along the ordinate while the irradiation divergence angle $\theta$ of the ultraviolet light 8 is plotted along the abscissa. As shown in FIG. 2, in the case where the angle $\theta$ is within a commonly employed range of about 30 to 40 degrees, the exposure ratio Wt/Ws is about 20%. Thus, the amount of exposure Wt of the wall surfaces of the through holes 2 is small compared with the amount of exposure Ws of the plane surfaces of the substrate 1. It is impossible, however, to selectively increase the level of exposure of the wall surfaces of the through holes 2 while retaining the level of exposure of the planar surfaces of the substrate 1 to an appropriate level. Thus, in order to obtain sufficient exposure on the wall surfaces of the through holes 2, it is necessary to increase the whole exposure level and to set this exposure level in accordance with the condition for obtaining a sufficient exposure level of the wall surfaces of the through holes 2 of the substrate 1. This, however, results in an undesirable increase of the resist pattern width on the planar surfaces of the substrate 1; this fact is clearly shown in FIG. 3, where the relations of the circuit pattern width (plotted in $\mu$m along the ordinate) with respect to the level of exposure (plotted along the abscissa in mJ/cm$^2$) are shown in the three cases where the designed values of the pattern width are 100 $\mu$m, 150 $\mu$m, and 200 $\mu$m, respectively; when the exposure level is in the range (shaded in the figure) in which the exposure level of the through holes is proper, the width of the planar patterns on the substrate 1 is increased by about 20% due to excessive exposure. Thus, the above method of exposure has the disadvantage that high density printed circuit boards with finer circuit patterns cannot be produced with accuracy and reliability.

SUMMARY OF THE INVENTION

It is therefore a primary object of this invention to provide a method of exposing a resist on a substrate of a printed wiring board having through holes, according to which the wall surfaces of the through holes can be exposed stably and reliably without increasing the pattern width of the circuit pattern to be formed on the planar surfaces of the substrate.

The above object is accomplished according to the principle of this invention by a method of exposing a resist formed on a substrate having at least one cylindrical through hole, wherein an opening of the through hole and the planar surface of the substrate are scanned by an exposure energy beam (such as a converging electron beam generated by an electron beam direct writing system) according to a predetermined pattern, and, during irradiation over the opening area of the through hole, an irradiation inclination angle is formed with respect to a normal to the opening area of the through hole, such that an incident-beam irradiated portion on the wall surface, whose resist is directly irradiated with the exposure energy beam, and a reflected-beam irradiated portion on the wall surface, whose resist is irradiated with a reflected exposure energy beam generated by a reflection of the incident exposure energy beam at the resist on the incident-beam irradiated portion, are exposed simultaneously. The irradiation inclination angle is preferred to be controlled to a value from 0 degrees up to 7 degrees; further, the inclination angle may be controlled in accordance with the depth and radius of the through hole.

Preferably, especially in the case where the depth of the through hole is large, an amount of exposure per unit area over the opening area of the through hole is controlled to not be less than 2h/r times the amount of exposure per unit area over the planar surface of the substrate, wherein h designates the depth of the through hole and r designates the radius thereof. By this measure, a sufficient exposure level of the wall surface of the through hole is ensured.

According to another aspect of this invention, which may be combined with the first aspect as defined above, the above object is accomplished by a method of exposing a resist formed on a substrate of a printed wiring board having at least one through hole, wherein an opening of the through hole and the planar surface of the substrate are irradiated with a converging exposure energy beam (such as a converging electron beam generated by an electron beam direct writing system) according to a predetermined pattern, and, during irradiation of the through hole, the converging exposure energy beam entering into the through hole via an opening thereof is reflected by means of a reflector plate disposed at an opposite opening of the through hole, such that the resist on the wall surface of the through hole is exposed simultaneously both by the converging exposure energy beam directly incident thereon and by the exposure energy beam reflected at the reflector plate.

The novel features which are believed to be characteristic of this invention are set forth with particularity in the appended claims. This invention itself, however, may best be understood, together with further objects and advantages thereof, by reference to the detailed description of the preferred embodiments taken in conjunction with the accompanying drawings.

BRIEF DESCRIPTION OF THE DRAWINGS

In the drawings, the same reference numerals represent the same or corresponding parts or portions.

DETAILED DESCRIPTION OF THE PREFERRED EMBODIMENTS

Referring now to FIGS. 4 to 7 of the drawings, embodiments according to this invention will be described.

Figure 1:
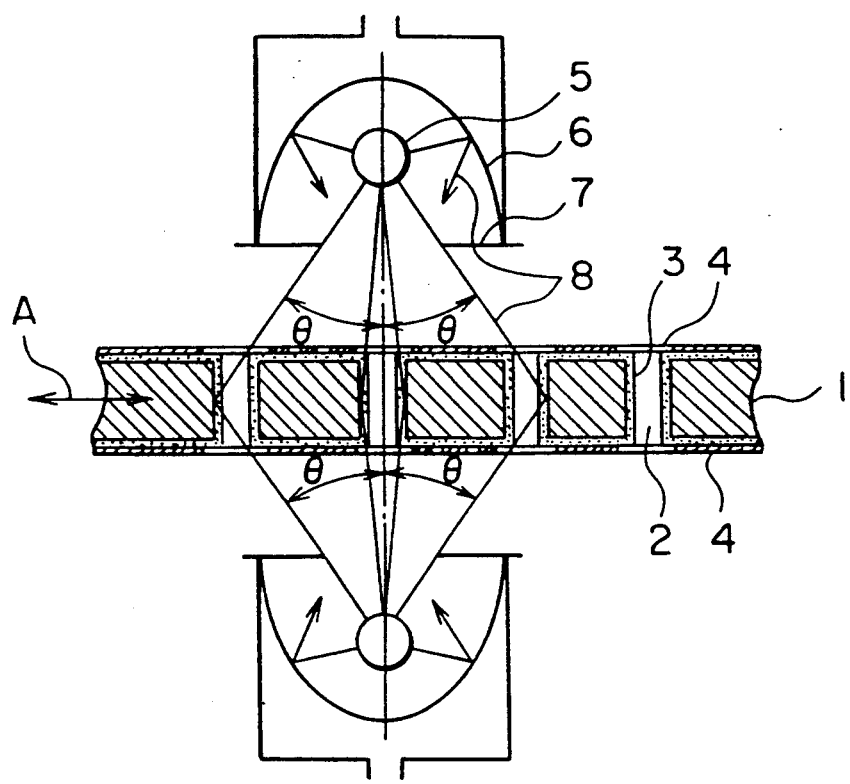
FIG. 1 is a vertical sectional view of a conventional exposure device during the exposure operation of a printed wiring board having through holes.
Figure 2:
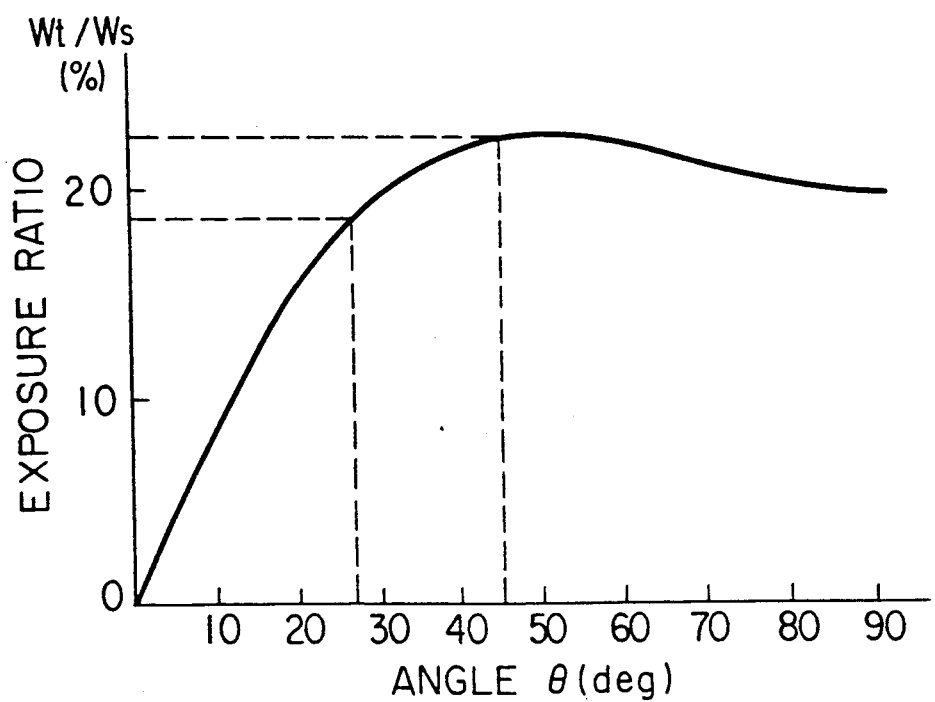
FIG. 2 is a diagram showing the exposure ratio curve which represents the exposure level of the through hole with respect to the exposure of the planar surface of the substrate in the case of the exposure operation effected by means of the device of FIG. 1.
Figure 3:
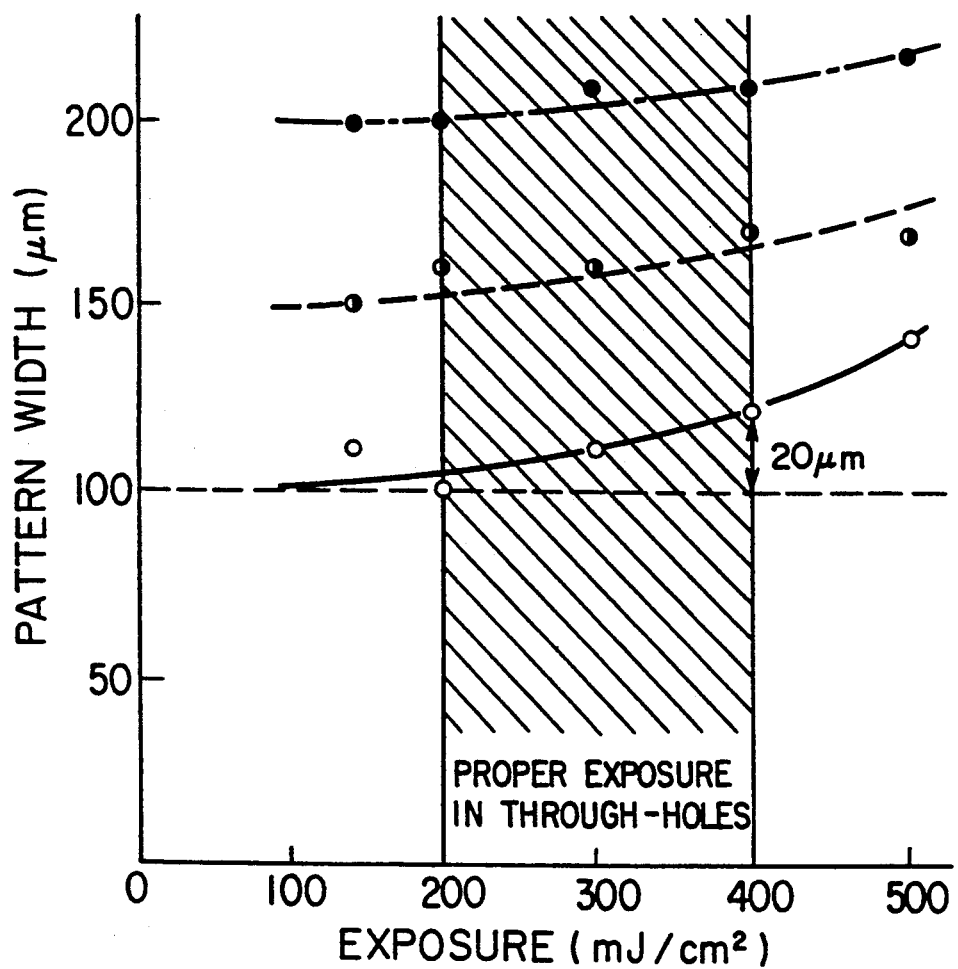
FIG. 3 is a diagram showing the increase of the pattern width over the designed values thereof, which increase takes place in the case of the exposure method utilizing the device of FIG. 1.
Figure 4:
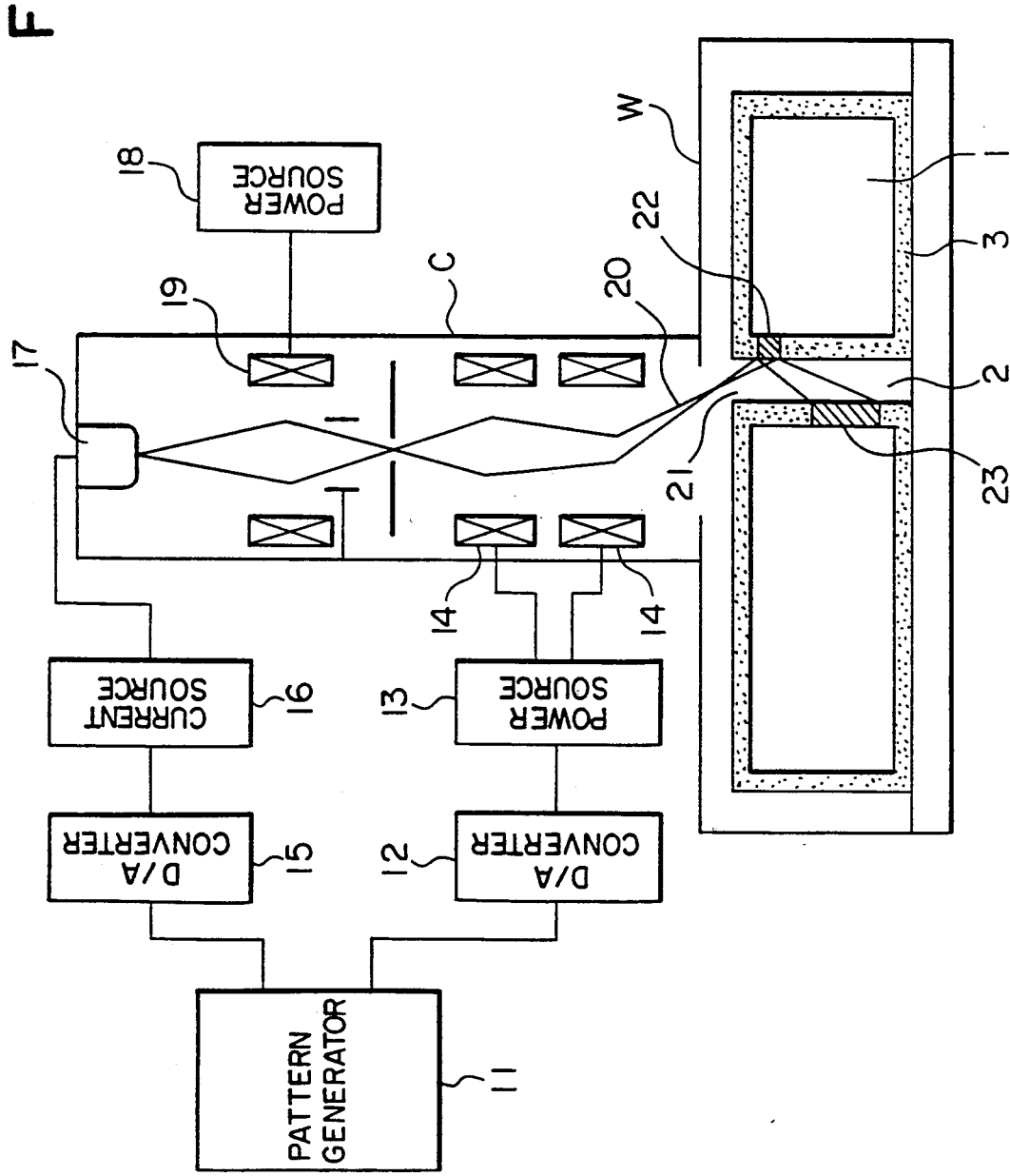
FIG. 4 is a diagramatic elevational sectional view of the electron beam direct writing system utilized by an exposure method according to this invention.
Figure 5:
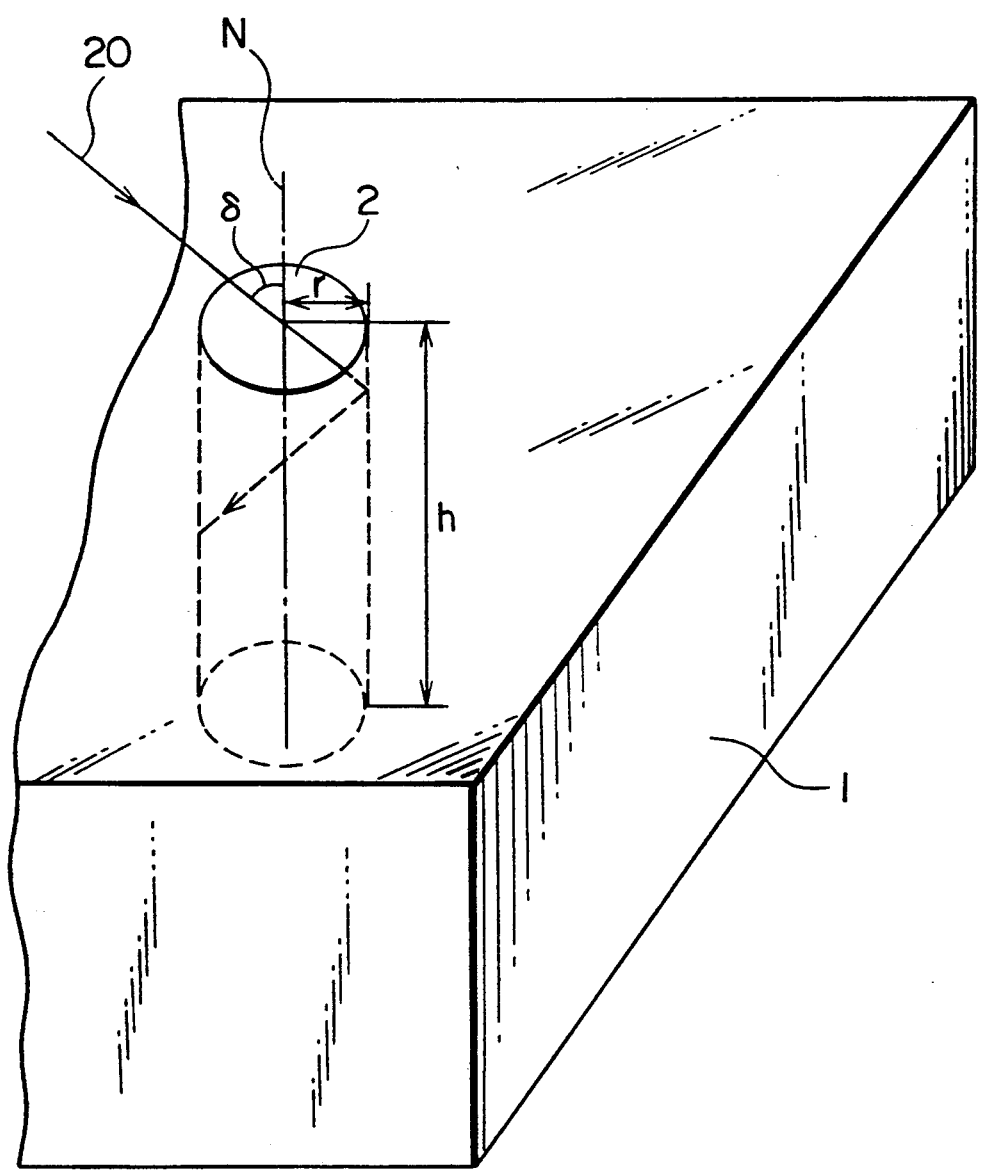
FIG. 5 is a perspective view of the main portion of the system of FIG. 4.

Let us first describe a first embodiment of this invention referring to FIGS. 4 and 5, which show an overall sectional view and an enlarged perspective view, respectively, of an electron beam as the exposure energy beam for exposing printed wiring boards. In the figures, the electron beam direct writing system includes: a pattern generator 11, D/A converter 12 for deflection of the electron beam, deflection power source 13, deflection coils 14, D/A converter 15 for controlling electron beam current, electron beam current source 16, cathode 17 of the electron generating triode disposed in the electron beam column C, focusing power source 18, and focusing coil 19. The converging electron beam 20 produced in the electron beam column C irradiates and exposes the substrate 1 of a printed wiring board having through holes 2 (only one is shown in the figure) and covered with resist 3. The substrate 1 is disposed in a vacuum working chamber W coupled to the base of the electron beam column C, and, during exposure of the cylindrical through hole 2, the converging electron beam 20 produced in the column C enters into the cylindrical through hole 2 through the opening area 21 of the through hole 2, forming an inclination angle $\delta$ with respect to the normal N to the opening area 21 of the through hole 2, as best shown in FIG. 5, where reference character r designates the radius of the through hole 2 and reference character h designates the depth of the through hole 2. The converging electron beam 20 is reflected at the incident-beam irradiated portion 22 on the wall surface of the through hole 2, to fall on the reflected-beam irradiated portion 23 as a reflected beam. The resist 3, which may be made of a typical photoresist generally utilized in the photolithography process, is formed on the copper-clad substrate 1 by the electrodeposition method; the resist 3 covers the whole wall surface of the through hole 2 of the substrate 1, as well as the planar surfaces of the substrate 1.

The exposure operation by the electron beam direct writing system of FIG. 4 is effected as follows. The CAD (computer aided design) data for the circuit pattern to be formed on the printed wiring board 1 is converted into the direct writing vector data in a CAM (computer aided manufacturing) work-station (not shown); on receiving this data, the pattern generator 11 generates scanning signals corresponding to the circuit pattern to be formed on the printed wiring board 1. Thus, an electron beam is emitted from the cathode 17 of the triode in response to the current supplied thereto from the electron beam current source 16 which is controlled by the output of the D/A converter 15 for the electron beam current, which D/A converter converts a digital signal received from the pattern generator 11 into a corresponding analog signal. Further, the electron beam emitted from the cathode 17 is converged and focused by the magnetic field generated by the focusing coil 19, which is supplied with a focusing current from the focusing power source 18, and which is also controlled by an output of the pattern generator 11. The converging (i.e., focused) electron beam 20 thus formed is deflected by the deflection coils 14 in response to scanning signals generated by the pattern generator 11. Namely, the digital scanning signals generated by the pattern generator 11 concerning the scanning position and the scanning speed of the electron beam 20 are converted at a high speed into corresponding analog signals by means of the deflection D/A converter 12; in accordance with the analog signals received from the D/A converter 12, the deflection power source 13 supplies necessary currents to the deflection coils 14 such that the scanning position and the scanning speed are controlled by the magnetic field produced by the deflection coils 14, in accordance with the scanning signal generated by the pattern generator 11. Thus, the converging electron beam 20 is scanned on the substrate 1 according to the predetermined circuit pattern.

During the above-described exposure process, the converging electron beam 20 is irradiated over the whole region of the opening 21 of the through hole 2 in such a manner that the converging electron beam 20 forms a predetermined inclination angle δ different from 0 degrees with respect to the normal N to the opening area 21 of the through hole 2 (see FIG. 5). The inclination angle δ of the converging electron beam 20 with respect to the normal N to the opening area 21 of the through hole 2 is preferred to be controlled to a value different from 0 degrees up to 7 degrees. Further, the inclination angle is preferred to be determined on the basis of the radius r and the depth h of through hole 2; more specifically it may be determined on the basis of the ratio r/h of the radius r and the depth h of the through hole. As a result of the formation of the inclination angle of the electron beam 20, the converging electron beam 20 exposes not only the incident-beam irradiated portion 22 whose resist 3 covering the wall surface of the through hole 2 is directly irradiated by the converging electron beam 20, but also the reflected-beam irradiated portion 23 simultaneously, whose resist 3 on the wall surface of the through hole 2 is irradated by the reflected electron beam generated by the reflection of the converging electron beam 20 at the resist 3 at the incident-beam irradiated portion 22. Thus, the utilization efficiency of the converging electron beam 20 during the through-hole wall surface exposure is dramatically increased compared with the efficiency during the circuit pattern formation upon the upper plane surface of the substrate 1; hence the wall surfaces of the through holes 2 can be exposed without shadows formed thereon, and printed wiring boards having through holes can be exposed with enhanced efficiency, reliabilty, and stability.

In the case of the electron beam direct writing system such as that shown in FIG. 4, in contrast to the conventional ultraviolet light lamps utilized for conventional exposure processes, the amount of exposure per unit area (which may be measured in mJ/cm$^2$) by the electron beam can be controlled and varied from time to time precisely at a high variation speed and with high accuracy; this control of the amount of exposure per unit area can be effected, for example, by (a) controlling the electron beam current supplied to the cathode 17 of the electron beam generating triode in accordance with the command from the pattern generator 11 via the D/A converter 15 and the electron beam current source 16, or (b) controlling the scanning speed of the converging electron beam 20 in accordance with the command from the pattern generator 11, which command is executed via the deflection D/A converter 12, the reflection power source 13, and the deflection coils 14. Thus, according to a preferred aspect of this invention, the amount of exposure per unit area (measured in mJ/cm$^2$) over the opening area 21 of the through hole 2 is controlled to not less than 2h/r (h being the depth and r the radius of the through hole 2, as shown in FIG. 5) times the amount of exposure per unit area (measured in mJ/cm$^2$) over the plane surface of the substrate 1. It is noted in this connection that, as described above, the utilization efficiency of the electron beam during the exposure of the wall surface of the through holes 2 can be enhanced by irradiating the converging electron beam 20 at an inclination angle δ with respect to the normal N to the opening area 21 of the through hole 2; thus, in the case where the depth h of the through hole 2 is relatively small, the above-mentioned control of the amount of exposure is not necessary. However, in the case where the depth h of the through hole 2 is relatively great, the differential control of the exposure levels over the plane surface of the substrate 1 and over the opening area of the through hole 2 is preferred; namely, since the area 2πr·h of the wall surface of the cylindrical through hole 2 is equal to 2h/r times the area πr$^2$ of the opening area 21 of the through hole 2, the wall surface of the through hole 2 can be exposed with a more enhanced stability by controlling the amount of exposure per unit area over the opening area 21 of the through hole 2 to not less than 2h/r times the amount of exposure per unit area during the planar pattern formation over the plane surface of the substrate 1. It is further noted in this connection that since the amount of exposure over the opening area 21 of the through hole 2 is controlled independently of the amount of exposure during the planar pattern formation over the plane surface of the substrate 1, the circuit pattern width or the precision of the circuit pattern on the plane surface of the substrate 1 can be maintained without degradation.

Figure 6:
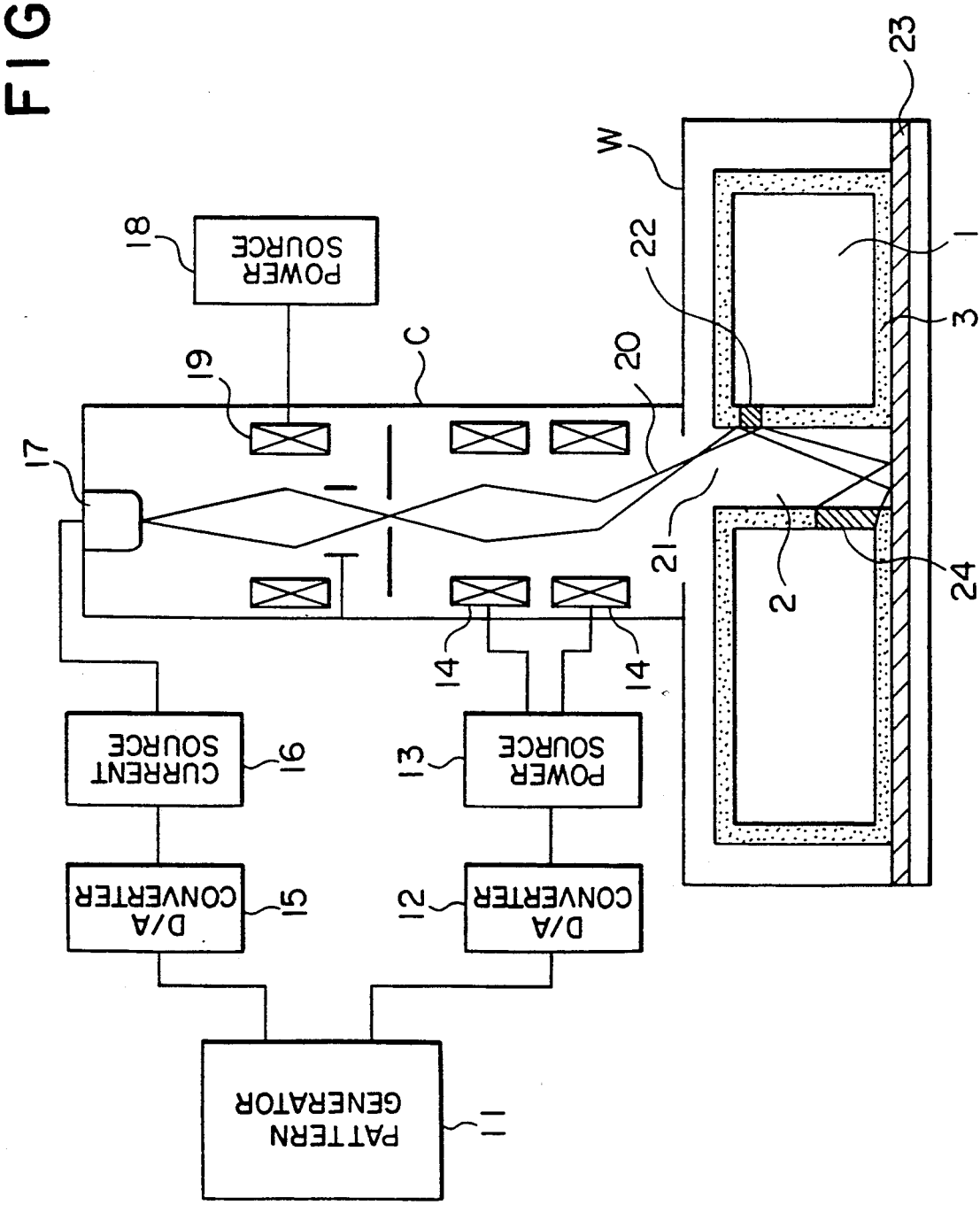
FIG. 6 is a view similar to that of FIG. 4, but showing a system utilized by an exposure method according to a second aspect of this invention.

Referring now to FIG. 6 of the drawings, a method of exposure according to a second embodiment of this invention, which also utilizes an electron beam direct writing system for producing a converging electron beam as the exposure energy beam is described. In FIG. 6, the electron beam column C (comprising the cathode 17 of the triode, the focusing coil 19, and the deflection coils 14), as well as the pattern generator 11, the deflection D/A converter 12, deflection power source 13, electron beam current control D/A converter 15, electron beam current source 16, and the focusing power source 18, are organized and operated similarly as in the case of the electron beam direct writing system of FIG. 4. Further, the substrate 1 having through holes 2 and covered with resist 3 is disposed in the vacuum working chamber B, as in the case of the above-described system shown in FIG. 4; thus, for the description thereof, reference should be made to the above-description of the first embodiment of FIG. 4.

However, in the case of the system shown in FIG. 6, reflector plate 23 is disposed within the working chamber W at the bottom opening of the through hole 2 opposite to the opening irradiated by the converging electron beam 20. Thus, as shown in FIG. 6, the reflected-beam irradiated portion 23, which is irradiated and exposed by a reflected beam of relatively low directivity produced by the reflection of a portion of the electron beam 20 at the incident-beam irradiated portion 22 and at the reflector plate 23, is exposed simultaneously as the incident-beam irradiated portion 22, whose resist 3 covering the wall surface of the through hole 2 is directly irradiated and exposed by the converging electron beam 20. Thus, the utilization efficiency of the converging electron beam 20 during the through-hole wall surface exposure is further increased and enhanced, compared with the utilization efficiency of the electron beam 20 during the circuit pattern formation upon the plane surfaces of the substrate 1; hence the wall surfaces of the through holes 2 can be exposed without shadows formed thereon, and printed wiring boards 1 having through holes 2 can be exposed with more enhanced efficiency, stability, and reliability.

Figure 7:
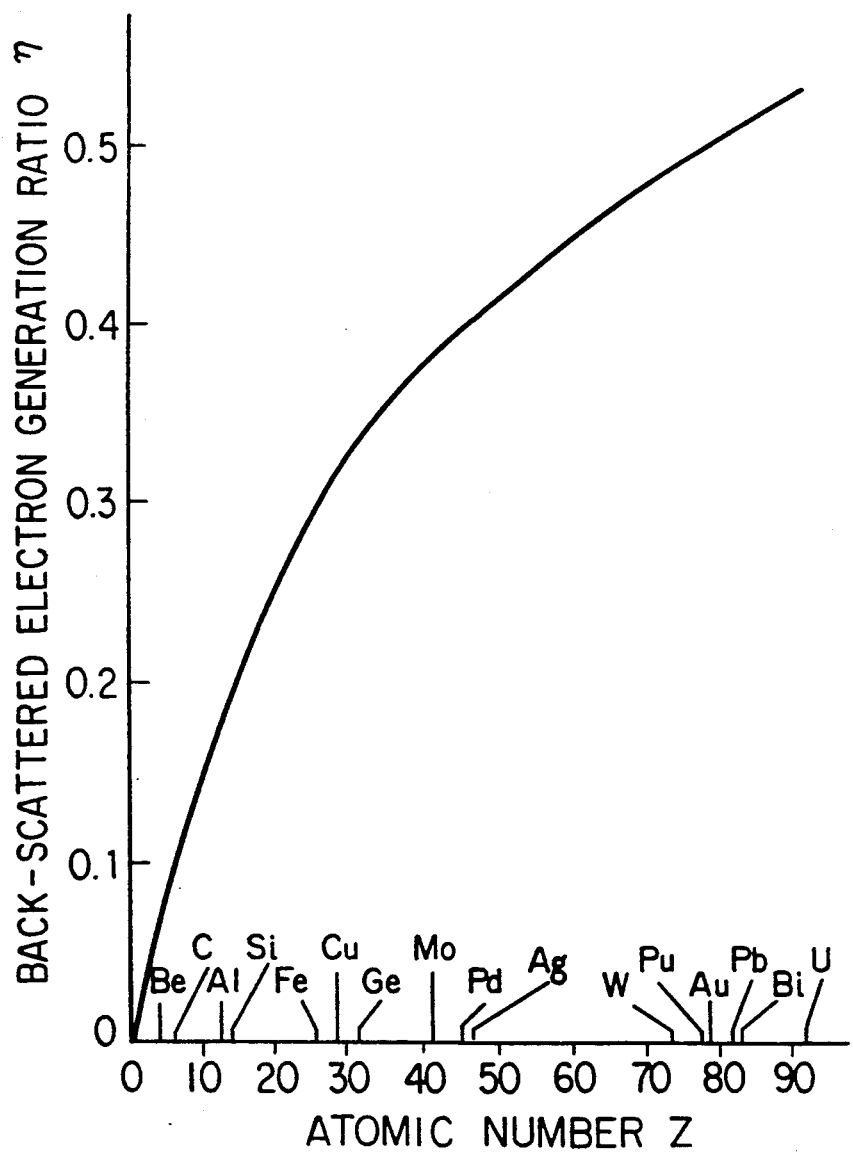
FIG. 7 shows the relation between the atomic number and the back-scattered electron generation ratio.

FIG. 7 shows the relationship between the atomic number Z and the back-scattered electron generation ratio $\eta$, which relationship is taken from: "Electron/Ion Beam Handbook", p. 621, edited by the 132nd committee of Nihon Gakujutsu Shinkokai, and published by Nikkan Kogyo Shinbunsha, 1986. In view of the relationship between the atomic number Z and the back-scattered electron generation ratio $\eta$ shown in FIG. 7, in the case where an electron beam is utilized as the exposure energy of the resist 3 on the substrate 1, the reflector plate 23 of the system of FIG. 6 is preferred to be made of a plate of a heavy metal, or a commonly used ferrous metal material covered with a heavy metal, the heavy metal being selected from the group consisting of molybdenum (Mo), palladium (Pd), silver (Ag), tungsten (W), gold (Au), lead (Pb), and bismuth (Bi), so that a greater portion of the electron beam is reflected at the reflector plate 23 and the utilization efficiency of the electron beam is further enhanced.

While description has been made of the particular embodiments of this invention, it will be understood that many modifications may be resorted to without departing from the spirit thereof. For example, although a converging electron beam is utilized as the exposure energy beam for exposing the resist on the substrate of printed wiring boards having through holes, other exposure energy beams such as ion beams and laser beams may be utilized as the exposure energy beams. The appended claims are contemplated to cover any such modifications as fall within the true spirit and scope of this invention.

What is claimed is:

1. A method of exposing a resist formed on a substrate having at least one cylindrical through hole, wherein said resist covers a wall surface of the cylindrical through hole as well as a planar surface of the substrate, said method comprising the steps of:
   irradiating an opening area of the through hole and the planar surface of the substrate with an exposure energy beam according to a predetermined pattern;
   controlling an amount of exposure per unit area over the opening area of the cylindrical through hole to not less than 2h/r times an amount of exposure per unit area over the planar surface of the substrate, wherein h is the depth of the cylindrical through hole and r is the radius of the cylindrical through hole; and
   positioning the exposure energy beam so that the beam is incident on the opening area of the through hole at an irradiation inclination angle with respect to a normal to the opening area of the through hole, such that a first portion of the wall-surface of the through hole is irradiated by an incident beam and a second portion of the wall surface of the through hole is irradiated by a beam reflected from the first portion, whereby the first and second wall portion are irradiated simultaneously.

2. A method of exposing a resist on a substrate as claimed in claim 1, wherein the amount of exposure per unit area over the planar surface of the substrate and the amount of exposure per unit area over the opening area of the through hole are controlled independently of each other.

3. A method of exposing a resist on a substrate as claimed in claim 1, wherein said exposure energy beam is selected from the group consisting of electron beam, ion beam, and laser beam.

* * * * *